United States Patent
Xin

(10) Patent No.: US 9,824,731 B2
(45) Date of Patent: Nov. 21, 2017

(54) DATA READING CIRCUIT

(71) Applicant: Huawei Technologies Co., Ltd., Shenzhen (CN)

(72) Inventor: Hengchao Xin, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/464,670

(22) Filed: Mar. 21, 2017

(65) Prior Publication Data

US 2017/0270984 A1    Sep. 21, 2017

(30) Foreign Application Priority Data

Mar. 21, 2016  (CN) .......................... 2016 1 0160841

(51) Int. Cl.
  *G11C 7/22*    (2006.01)
  *G11C 7/10*    (2006.01)

(52) U.S. Cl.
  CPC ............... *G11C 7/222* (2013.01); *G11C 7/10* (2013.01)

(58) Field of Classification Search
  CPC ...................................... G11C 7/222
  USPC ................................... 365/233.11
  See application file for complete search history.

(56) References Cited

U.S. PATENT DOCUMENTS

| | | | |
|---|---|---|---|
| 5,793,823 A | 8/1998 | Nishio et al. | |
| 2008/0065922 A1* | 3/2008 | Dour | G06F 1/12 713/400 |
| 2013/0170591 A1* | 7/2013 | Su | H04L 7/02 375/359 |

OTHER PUBLICATIONS

Cummings, C., "Clock Domain Crossing (CDC) Design & Verification Techniques Using System Verilong," XP055306405, World Class Verilog & SystemVerilog Training, Nov. 30, 2008, 56 pages.
Foreign Communication From A Counterpart Application, European Application No. 17161840.8, Extended European Search Report dated Jul. 26, 2017, 6 pages.

* cited by examiner

*Primary Examiner* — Huan Hoang
*Assistant Examiner* — Jay Radke
(74) *Attorney, Agent, or Firm* — Conley Rose, P.C.

(57) ABSTRACT

A data reading circuit including a phase difference determining module, a time delay detection module, and a reading control module, and the phase difference determining module is connected to the echo clock signal and a clock signal of the second clock domain. The phase difference determining module is configured to determine a phase difference between the echo clock signal and the clock signal of the second clock domain; the time delay detection module is configured to detect a time delay value in transmission of data from a buffer to a flip-flop; and the reading control module is configured to determine, according to the phase difference and the time delay value, a triggering edge, at which the flip-flop can read data output by the buffer, of the clock signal of the second clock domain.

11 Claims, 7 Drawing Sheets

DATA READING CIRCUIT

CROSS-REFERENCE TO RELATED APPLICATION

This application claims priority to Chinese Patent Application No. 201610160841.8, filed on Mar. 21, 2016, which is hereby incorporated by reference in its entirety.

TECHNICAL FIELD

The present disclosure relates to the field of electronic technologies, and in particular, to a data reading circuit.

BACKGROUND

A source synchronization technology is a cross clock domain synchronization technology with a low delay, and is mainly applied to a process of data exchange between clock domains having a same source and a same frequency but different phases. A major technical principle of the technology is that a first clock domain simultaneously sends data and an echo clock signal (that is, a clock signal of the first clock domain) to a second clock domain; and the second clock domain writes the data according to the echo clock signal, and reads the written data according to a clock signal of the local domain (that is, a clock signal of the second clock domain). A specific implementation process may be shown in FIG. 1. The first clock domain simultaneously sends data and an echo clock signal to the second clock domain; a First In First Out (FIFO) buffer in the second clock domain regularly writes data at each beat; and then a D-type flip-flop (DFF) in the second clock domain regularly reads data at each beat according to a clock signal of the local domain. The echo clock signal has the same frequency as the clock signal of the second clock domain, and therefore the foregoing data reading method is feasible as long as a phase difference between the echo clock signal and the second clock domain is determined.

Currently, the phase difference may be determined using an associated data synchronization (Data Sync) signal. Referring to FIG. 2, the first clock domain generates a Data Sync signal for an echo clock signal, and the second clock domain may calculate, according to the Data Sync signal, a phase difference between a clock signal of the local clock domain and the echo clock signal. However, when a Data Sync signal is used, an input/output (I/O) interface that is used to transmit the Data Sync signal needs to be added, which increases hardware overheads. In addition, a phase relationship between a Data Sync signal and data needs to be strictly maintained during a signal transmission process, which increases difficulty of implementation.

SUMMARY

Embodiments of the present disclosure provide a data reading circuit, so that a phase difference between an echo clock signal and a clock signal of a local domain can be determined, thereby implementing data reading.

An embodiment of the present disclosure provides a data reading circuit. The circuit is applied to a second clock domain, the second clock domain includes a buffer configured to write data sent by a first clock domain and a flip-flop configured to read data output by the buffer, the first clock domain simultaneously sends the data and an echo clock signal, and the echo clock signal is a clock signal of the first clock domain. The data reading circuit includes a phase difference determining module, a time delay detection module, and a reading control module, the phase difference determining module is connected to the echo clock signal and a clock signal of the second clock domain, the phase difference determining module is connected to the reading control module, and the time delay detection module is connected to the reading control module. The phase difference determining module is configured to determine a phase difference between the echo clock signal and the clock signal of the second clock domain, and send the phase difference to the reading control module. The time delay detection module is configured to detect a time delay value in transmission of the data from the buffer to the flip-flop, and send the time delay value to the reading control module. The reading control module is configured to determine, according to the phase difference and the time delay value, a triggering edge, at which the flip-flop can read the data output by the buffer, of the clock signal of the second clock domain.

In a first possible implementation manner, the phase difference determining module includes N identical time delayers, N+1 identical D flip-flops, and a phase difference determining unit, where N is an integer greater than 1; the N time delayers are successively connected in series; an input port of the first time delayer is connected to the clock signal of the second clock domain; a time delay generated by the N time delayers is greater than a clock cycle of the clock signal of the second clock domain; input ports of the N+1 D flip-flops are connected to the echo clock signal; a clock port of the first D flip-flop is connected to the input port of the first time delayer; clock ports of the remaining N D flip-flops are successively connected to output ports of the N time delayers; output ports of the N+1 D flip-flops are connected to the phase difference determining unit; the phase difference determining unit is connected to the echo clock signal; and the phase difference determining unit is configured to determine, according to output results of the N+1 D flip-flops, the phase difference between the echo clock signal and the clock signal of the second clock domain, and send the phase difference to the reading control module.

With reference to the first possible implementation manner, in a second possible implementation manner, the phase difference determining unit is configured to first, at a time point corresponding to a level falling edge of the echo clock signal, obtain levels of output signals of the second flip-flop to the $(N+1)^{th}$ D flip-flop, where in the levels of the output signals, the first a levels are high levels, the middle b levels are low levels, the last c levels are high levels, and a, b, and c are positive integers; then calculate, according to a formula $$\lambda = \frac{b-a}{2 \cdot b} \cdot 360°,$$

phase difference between the echo clock signal and the clock signal of the second clock domain, where λ denotes the phase difference.

In a third possible implementation manner, the reading control module is configured to, if the triggering edge at which the flip-flop reads the data output by the buffer is a rising edge, when the phase difference is greater than or equal to the time delay value, use a next rising edge, from a time point at which the buffer writes the data, of the clock signal of the second clock domain as a time point at which the flip-flop reads the data; or when the phase difference is less than the time delay value, according to a formula $j=(\Delta t_{max}-\lambda)T+2$, use the $j^{th}$ rising edge, from a time point at which the buffer writes the data, of the clock signal of the second clock domain as a time point at which the flip-flop reads the data, where $\Delta t_{max}$ denotes the time delay value, $\lambda$ denotes the phase difference, / denotes an exact-division symbol, and T denotes a cycle of the clock signal of the second clock domain. If the triggering edge at which the flip-flop reads the data output by the buffer is a rising edge, when the phase difference is greater than or equal to the time delay value, use a next rising edge, from a time point at which the buffer writes the data, of the clock signal of the second clock domain as a time point at which the flip-flop reads the data; or when the phase difference is less than the time delay value, according to a formula $j=(\Delta t_{max}-T/2-\lambda)/T+2$, use the $j^{th}$ rising edge, from a time point at which the buffer writes the data, of the clock signal of the second clock domain as a time point at which the flip-flop reads the data, where $\Delta t_{max}$ denotes the time delay value, $\lambda$ denotes the phase difference, / denotes an exact-division symbol, and T denotes a cycle of the clock signal of the second clock domain.

With reference to the first possible implementation manner, in a fourth possible implementation manner, the phase difference determining module further includes a switch component, where the input port of the first time delayer is connected to the clock signal of the second clock domain using the switch component, and the switch component is configured to control connection and disconnection between the input port of the first time delayer and the clock signal of the second clock domain.

With reference to the fourth possible implementation manner, in a fifth possible implementation manner, the switch component is an inside clock generator (ICG) switch. The input port of the first time delayer is connected to an output port of the ICG switch, an input port of the ICG switch is connected to the clock signal of the second clock domain, and an enabling port of the ICG switch is connected to an enabling signal. The switch component is configured to control connection and disconnection between the input port of the first time delayer and the clock signal of the second clock domain.

With reference to the first possible implementation manner, in a sixth possible implementation manner, the time delayer is a gate circuit or multiple gate circuits that are connected in series.

With reference to the second possible implementation manner, in a seventh possible implementation manner, the D flip-flop is a D flip-flop that resists a metastable state.

It can be seen from the foregoing that, the data reading circuit in this embodiment of the present disclosure includes a phase difference determining module, a time delay detection module, and a reading control module, where the phase difference determining module may determine a phase difference between an echo clock signal and a clock signal of a local clock domain, the time delay detection module may detect a time delay value in internal transmission of data, and the reading control module may determine a time point for data reading according to the phase difference and the time delay value, thereby implementing data reading. In addition, in the embodiments of the present disclosure, except for I/O interfaces used to transmit the data and echo clock signal, the phase difference between the echo clock signal and the clock signal of the local clock domain can be determined without the need to add an extra I/O interface between two clock domains, thereby reducing hardware overheads and difficulty in implementation.

BRIEF DESCRIPTION OF DRAWINGS

To describe the technical solutions in the embodiments of the present disclosure or in the prior art more clearly, the following briefly describes the accompanying drawings required for describing the embodiments or the prior art. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are merely some but not all of the embodiments of the present disclosure. All other embodiments obtained by a person of ordinary skill in the art based on the embodiments of the present disclosure without creative efforts shall fall within the protection scope of the present disclosure.

Embodiments of the present disclosure are applied to a cross clock domain interaction scenario, and the interaction scenario includes at least two clock domains that have a same source and frequency but different phases. Each clock domain may be used as a sending end and a receiving end. When being used as a sending end, a clock domain sends data to another clock domain; and when being used as a receiving end, the clock domain receives data sent by another clock domain. To make the following text easy to understand, it is specified that a clock domain used as a sending end is a first clock domain, and a clock domain used as a receiving end is a second clock domain. It should be understood that, a clock domain may be used as either a sending end or a receiving end, and therefore the first clock domain and the second clock domain do not refer to two clock domains in space, but two logical clock domains.

Figure 1:
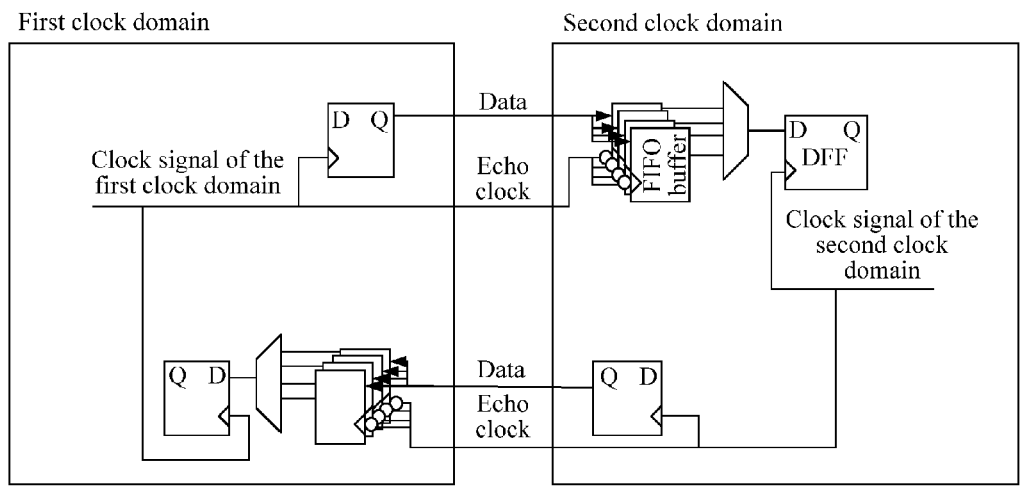
FIG. 1 is a schematic diagram of a cross clock domain synchronization technology in the prior art.
Figure 2:
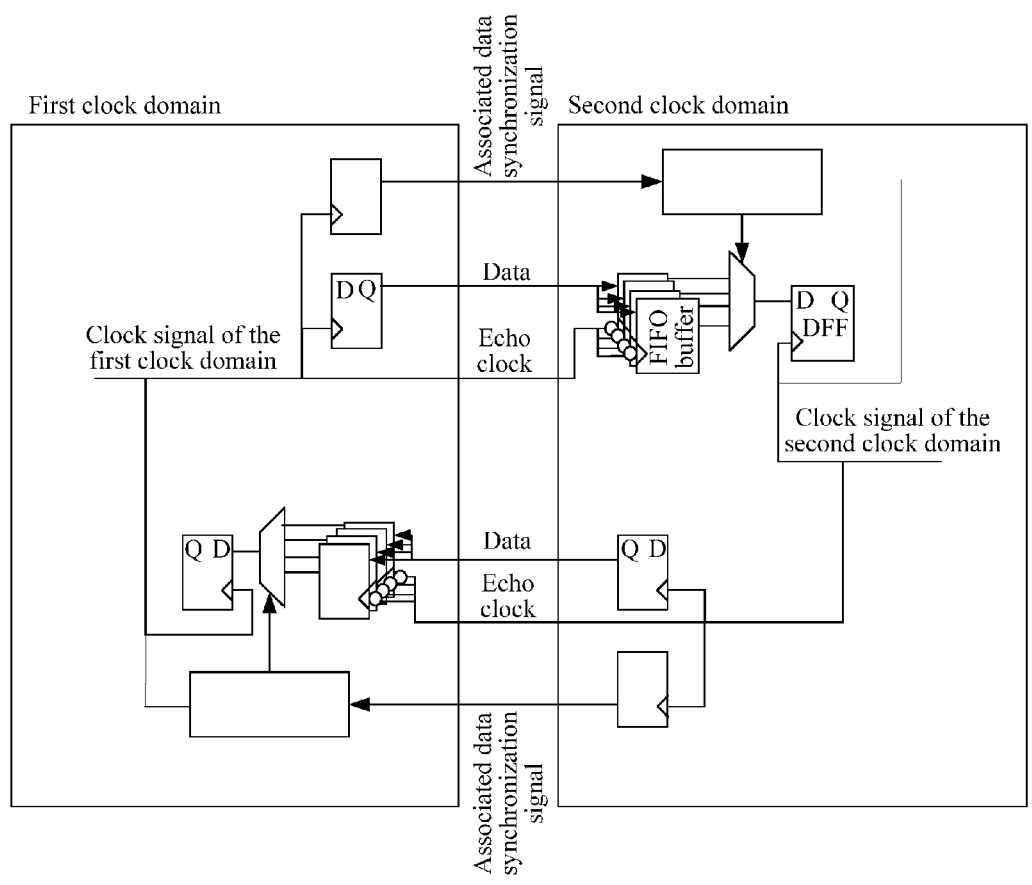
FIG. 2 is a schematic diagram of another cross clock domain synchronization technology in the prior art.
Figure 3:
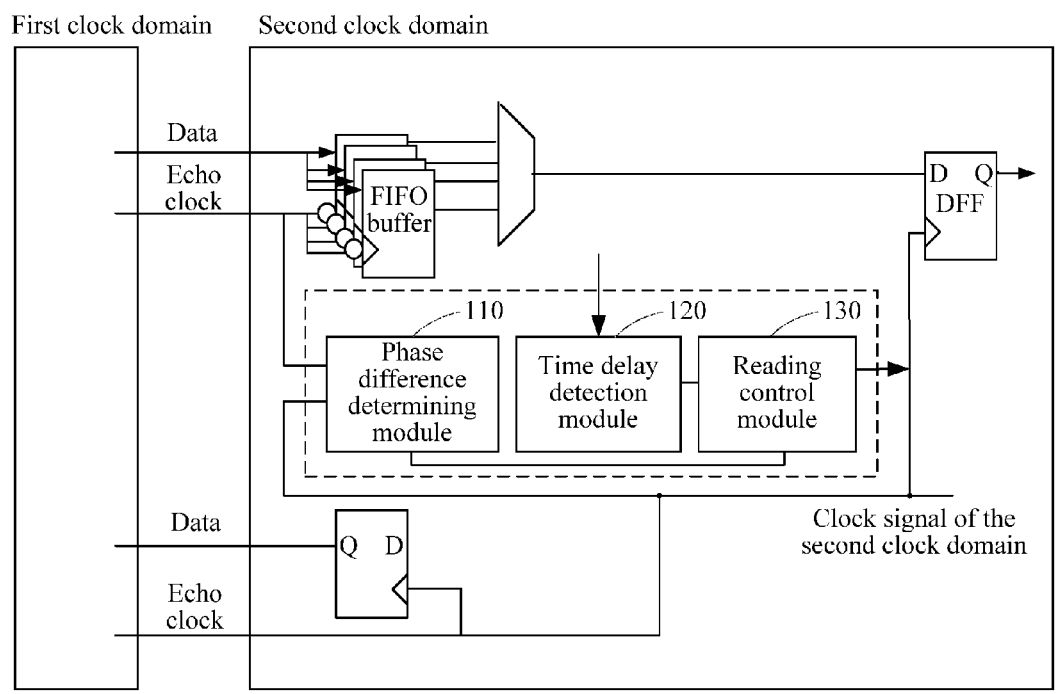
FIG. 3 is a schematic structural diagram of a data reading circuit according to an embodiment of the present disclosure.

FIG. 3 is a schematic structural diagram of a data reading circuit according to an embodiment of the present disclosure.

As shown in FIG. 3, a first clock domain in this embodiment simultaneously sends data and an echo clock signal to a second clock domain, and the echo clock signal is a clock signal of the first clock domain. It should be noted that, it takes time to transmit the echo clock signal from the first clock domain to the second clock domain, and therefore there is a time delay between the echo clock signal received by the second clock domain and a current actual clock signal of the first clock domain.

As shown in FIG. 3, the second clock domain in this embodiment includes a buffer configured to write data sent by the first clock domain and a flip-flop DFF configured to read the data output by the buffer. It should be noted that, during transmission of the data and the echo clock signal from the first clock domain to the second clock domain, a phase difference may be strictly kept unchanged (for example, the phase difference is kept unchanged by designing transmission lines to have a same length or neighboring line locations), and therefore it is feasible to write the data according to the echo clock signal. During a specific implementation process, a buffer in the second clock domain may be a FIFO buffer shown in FIG. 3, and the FIFO buffer regularly writes data at each beat according to the echo clock signal.

As shown in FIG. 3, the data reading circuit in this embodiment includes a phase difference determining module 110, a time delay detection module 120, and a reading control module 130. The phase difference determining module 110 is connected to the echo clock signal and a clock signal of the second clock domain, the phase difference determining module 110 is connected to a reading control module 130, and the time delay detection module 120 is connected to the reading control module 130.

Figure 4:
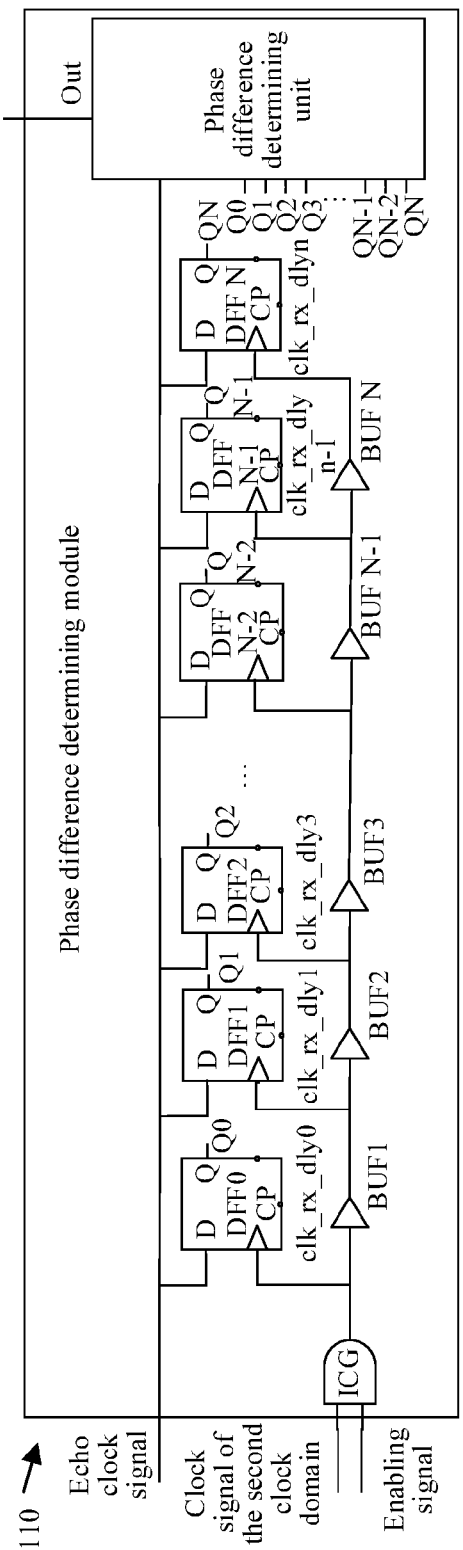
FIG. 4 is a schematic structural diagram of a time delay detection module according to an embodiment of the present disclosure.

The phase difference determining module 110 is configured to determine a phase difference between the echo clock signal and the clock signal of the second clock domain, and send the phase difference to the reading control module 130. The phase difference determining module 110 may further include, as shown in FIG. 4, N identical time delayers (BUF 1, BUF 2, BUF 3, ..., BUF N-1, and BUF N), N+1 identical D flip-flops (DFF 0, DFF 1, DFF 2, ..., DFF N-1, and DFF N), and a phase difference determining unit, where N is an integer greater than 1.

During a specific implementation process, an input port of BUF 1 is connected to a clock signal clk_rx of the second clock domain; BUF 1, BUF 2, BUF 3, ..., BUF N-1, and BUF N are successively connected in series; input ports D of DFF 0, DFF 1, DFF 2, ..., DFF N-1, and DFF N are connected to an echo clock signal clk_tx; a clock port CP of DFF 0 is connected to the input port of BUF 1; clock ports CP of DFF 1, DFF 2, ..., DFF N-1, and DFF N are successively connected to output ports of BUF 1, BUF 2, BUF 3, ..., BUF N-1, and BUF N; output ports Q of DFF 0, DFF 1, DFF 2, ..., DFF N-1, and DFF N are connected to the phase difference determining unit; the phase difference determining unit is connected to the echo clock signal; and an output port Out of the phase difference determining unit is connected to the reading control module 130.

The time delayer is configured to shift a phase of a signal. BUF 1, BUF 2, BUF 3, ..., BUF N-1, and BUF N perform phase shifting on clk_rx stage by stage, and separately output delayed clock signals clk_rx_dly_1, clk_rx_dly_2, clk_rx_dly_3, ..., clk_rx_dly_n-1, and clk_rx_dly_n. It is required that a total time delay generated by the N time delayers is greater than a clock cycle of clk_rx (that is, a phase difference between clk_rx_dly_n and clk_rx_dly_0 is greater than 360°). It should be understood that, when a D flip-flop detects a level rising edge at the clock port (CP), an output port Q of the D flip-flop outputs a signal received by the input port D. Because clk_rx and clk_tx are signals that differ only in phase, signals that are actually output by output ports Q 0, Q 1, ..., Q N-1, and Q N of the N+1 D flip-flops may be considered as clk_rx_dly_0, clk_rx_dly_1, clk_rx_dly_2, ..., clk_rx_dly_n-1, and clk_rx_dly_n.

Further, the phase difference determining unit determines, according to output results of the N+1 D flip-flops (that is, signals output by Q 0, Q 1, ..., Q N-1, and Q N), the phase difference between the echo clock signal and the clock signal of the second clock domain. A specific manner is as follows.

Figure 5:
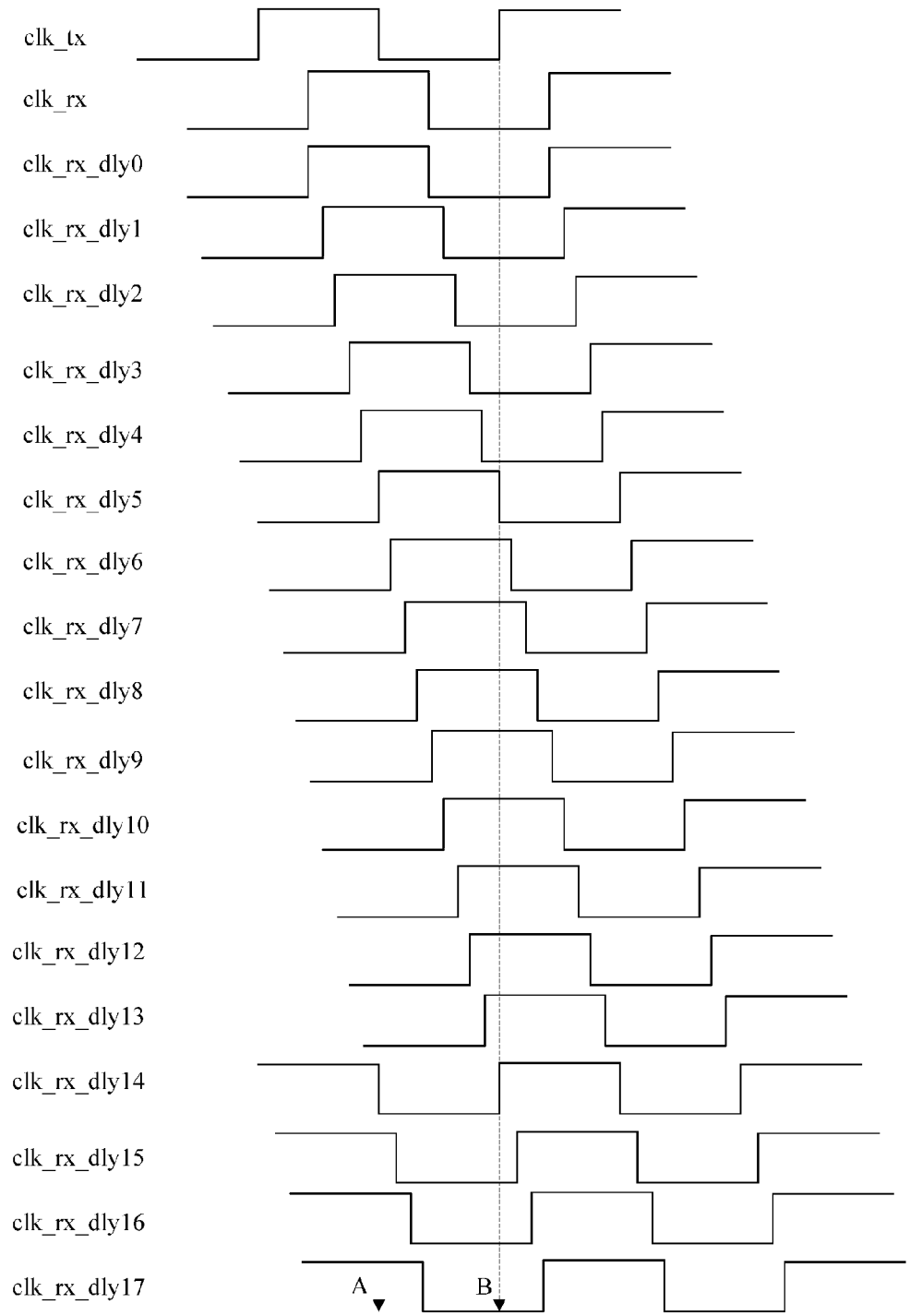
FIG. 5 is a schematic diagram of a time sequence of a signal according to an embodiment of the present disclosure.

At a time point corresponding to a level falling edge of the echo clock signal, levels of the output signals of Q 1, ..., Q N-1, and Q N are obtained; and in the levels, if the first a levels are high levels, the middle b levels are low levels, and the last c levels are high levels, and a, b, and c are positive integers, the phase difference between the echo clock signal and the clock signal of the second clock domain is calculated according to a formula $$\lambda = \frac{b-a}{2 \cdot b} \cdot 360°,$$

where λ denotes the phase difference. For example, assuming that phases of the echo clock signal clk_tx, the clock signal clk_rx of the second clock domain, and clk_rx_dly_0 to clk_rx_dly_n are as shown in FIG. 5, at a level falling edge of clk_tx (shown by A in FIG. 5), a sampling result of clk_rx_dly_1 to clk_rx_dly_n is 0x111110000000001111 (where "1" denotes a high level, and "0" denotes a low level), and therefore, it is obtained that a=5, b=9, and c=4. It can be known, according to "b=9", that clk_tx has nine unit delays from a level falling edge to a level rising edge, and therefore the phase of clk_tx has 2×9 unit delays in one cycle; and it can be known, according to "a=5 and b=9", that there are five unit delays from a level rising edge of clk_rx to a level falling edge of clk_tx, and therefore there are (9−5) unit delays from a rising edge of clk_rx to a previous rising edge of clk_tx. Therefore, a phase difference by which clk_rx lags behind clk_tx is ((9−5)/2×9)×360°=80°. It should be noted that, the phase difference between the echo clock signal and the clock signal of the second clock domain may also be calculated when it is detected that an output of Q 0 is a level rising edge (shown by B in FIG. 5). A specific derivation method is substantially the same, and details are not described herein again. However, a disadvantage of this implementation manner is that levels of output signals of Q 1 to Q N can only be obtained at a second level rising edge of the echo clock signal, lowering a calculation speed.

Optionally, a process of calculating, by the phase difference determining unit, the phase difference between the echo clock signal and the clock signal of the second clock domain may be implemented using software or a hardware circuit, and this is not specifically limited herein.

Further optionally, the phase difference determining module 110 may further include a switch component as shown in FIG. 4. The input port of BUF 1 is connected to the clock signal clk_rx of the second clock domain using the switch component, and the switch component is configured to control connection and disconnection between the input port of BUF 1 and clk_rx. Further, the switch component is an ICG switch. The input port of BUF 1 is connected to an output port of the ICG switch, an input port of the ICG switch is connected to clk_rx, an enabling port of the ICG switch is connected to an enabling signal, and the ICG switch is configured to control, according to the enable signal, connection and disconnection between the input port of BUF 1 and clk_rx. An advantage lies in that, the switch component may turn off a circuit without determining a phase difference, thereby lowering power consumption.

Further optionally, the time delayer (BUF 1, BUF 2, BUF 3, . . . , BUF N−1, or BUF N) is a gate circuit or multiple gate circuits that are connected in series.

Further optionally, the D flip-flop is a D flip-flop that resists a metastable state, and the metastable state refers to that the flip-flop cannot reach a stable state in a prescribed period of time. An advantage lies that, the D flip-flop that resists a metastable state can improve stability of a circuit.

The time delay detection module 120 is configured to detect a time delay value in transmission of data from the buffer to the flip-flop, and send the time delay value to the reading control module 130.

Referring to FIG. 3, the time delay detection module 120 detects a time delay value in transmission of data from an output port of the FIFO buffer to an input port D of the flip-flop. Optionally, a process of detecting a time delay value by the reading control module 130 may be implemented using software or a hardware circuit, and this is not specifically limited herein.

The reading control module 130 is configured to determine, according to the phase difference and the time delay value, a triggering edge, at which the flip-flop can read the data output by the buffer, of the clock signal of the second clock domain.

It should be noted that, a triggering edge of a flip-flop may include, according to a type thereof, a rising edge and a falling edge. For example, a triggering edge of a rising-edge flip-flop is a rising edge, and when a level rising edge is detected at a clock port (CP) of the rising-edge flip-flop, and an output port Q of the rising-edge flip-flop outputs a signal received by an input port D thereof.

Figure 6:
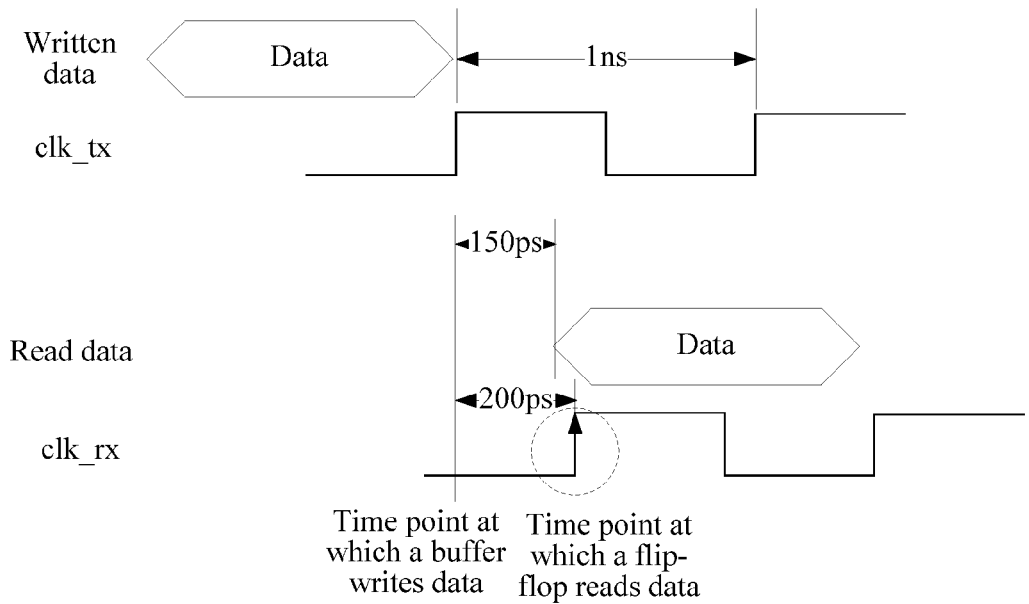
FIG. 6 is a schematic diagram of data reading according to an embodiment of the present disclosure.
Figure 7:
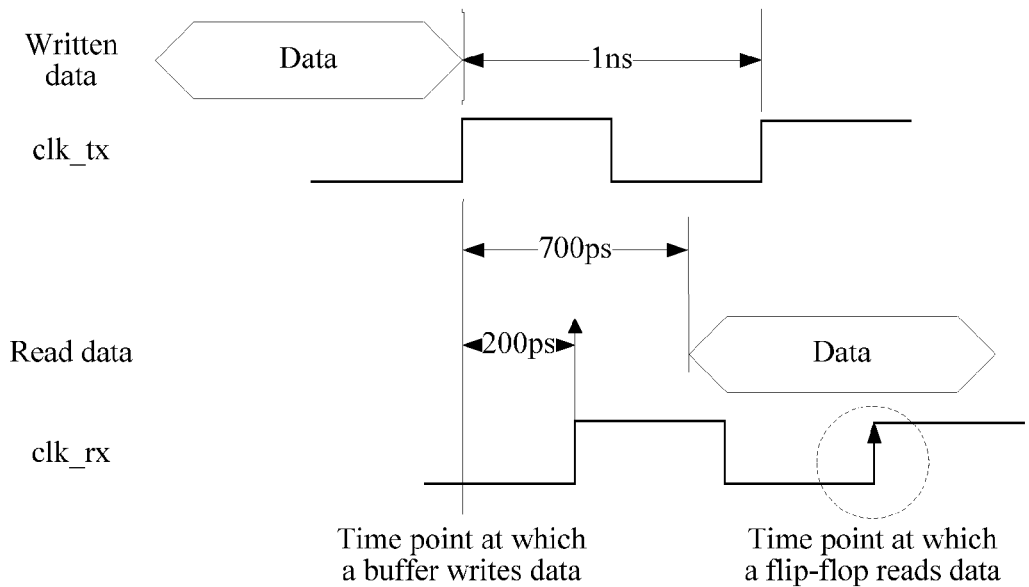
FIG. 7 is a schematic diagram of another type of data reading according to an embodiment of the present disclosure.

On one hand, if the triggering edge of the flip-flop is a rising edge, when it is determined that a time value corresponding to the phase difference is greater than or equal to the time delay value, a next rising edge of the clock signal of the second clock domain from a time point at which the FIFO buffer writes data is used as a time point at which the flip-flop reads data. For example, referring to FIG. 6, assuming that a clock cycle of the clock signal clk_rx of the second clock domain is 1 ns, a phase difference between clk_rx and the echo clock signal clk_tx is 72°, and a time delay value of data transmission is 150 picoseconds (ps), then the time value corresponding to the phase difference can be obtained through calculation: 200 ps (=1000 ps*72°/360°). Because 200 ps is greater than 150 ps, a next rising edge of clk_rx (shown by a circle in FIG. 6) is used as a time point for reading data, thereby implementing data reading. When it is determined that the time value corresponding to the phase difference is less than the time delay value, according to a formula j=($\Delta t_{max}$−λ)/T+2, the $j^{th}$ rising edge of the clock signal of the second clock domain from a time point at which the FIFO buffer writes data is used as a time point at which the flip-flop reads data, where $\Delta t_{max}$ denotes the time delay value, λ denotes the phase difference, / denotes an exact-division symbol, and T denotes the clock cycle of the clock signal of the second clock domain. For example, referring to FIG. 7, assuming that the clock cycle of the clock signal clk_rx of the second clock domain is 1 ns, the phase difference between clk_rx and the echo clock signal clk_tx is 72°, and the time delay value of data transmission is 700 ps, then the time value corresponding to the phase difference can be obtained through calculation: 200 ps (=1000 ps*72°/360°. Because 200 ps is less than 700 ps, it is obtained through calculation that j=(700−200)/1000+2=2, and therefore, the second rising edge of clk_rx (shown by a circle in FIG. 7) is used as a time point for reading data, thereby implementing data reading.

On the other hand, if the triggering edge of the flip-flop is a falling edge, when it is determined that the time value corresponding to the phase difference is greater than or equal to the time delay value, a next rising edge of the clock signal of the second clock domain from a time point at which the FIFO buffer writes data is used as a time point at which the flip-flop reads data. When it is determined that the time value corresponding to the phase difference is less than the time delay value, according to a formula j=($\Delta t_{max}$−T/2−λ)/T+2, the $j^{th}$ falling edge of the clock signal of the second clock domain from a time point at which the buffer writes data is used as a time point at which the FIFO flip-flop reads data, where $\Delta t_{max}$ denotes the time delay value, λ denotes the phase difference, / denotes an exact-division symbol, and T denotes the cycle of the clock signal of the second clock domain.

It can be seen from the foregoing that, the data reading circuit in this embodiment of the present disclosure includes the phase difference determining module 110, the time delay detection module 120, and the reading control module 130, where the phase difference determining module 110 can determine a phase difference between an echo clock signal and a clock signal of a local domain, the time delay detection module 120 can detect a time delay value in internal transmission of data, and the reading control module 130 can determine, according to the phase difference and the time delay value, a time point for reading data, thereby implementing data reading. In addition, in this embodiment of the present disclosure, except for I/O interfaces used to transmit the data and the echo clock signal, the phase difference between the echo clock signal and the clock signal of the local domain can be determined without the need to add an extra I/O interface between two clock domains, thereby reducing hardware overheads and difficulty in implementation.

Figure 8:
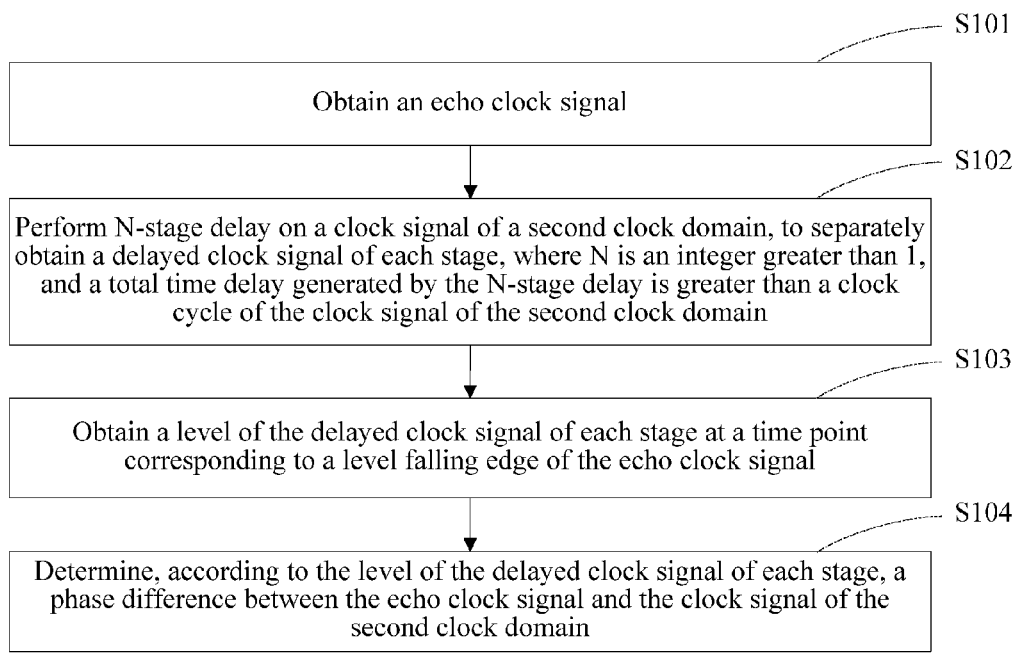
FIG. 8 is a schematic flowchart of a method for determining a phase difference according to an embodiment of the present disclosure.

FIG. 8 is a schematic flowchart of a method for determining a phase difference according to an embodiment of the present disclosure, and the method may be applied to the time delay detection module 110 in the method described in FIG. 3 and/or FIG. 4. As shown in the figure, a process of the method for determining a phase difference in this embodiment may include the following steps.

S101: Obtain an echo clock signal.

S102: Perform N-stage delay on a clock signal of a second clock domain, to obtain a delayed clock signal of each level, where N is an integer greater than 1, and a total time delay generated by the N-stage delay is greater than a clock cycle of the clock signal of the second clock domain.

For example, multi-stage delay is performed on the clock signal clk_rx of the second clock domain, to separately obtain delayed clock signals clk_rx_dly_1, clk_rx_dly_2, clk_rx_dly_3, . . . , clk_rx_dly_n−1, and clk_rx_dly_n of respective stages, where a phase difference between clk_rx_dly_n and clk_rx_dly_0 exceeds 360°, as shown in FIG. 5.

It should be noted that step S101 and step S102 are performed at the same time rather than successively.

S103: Obtain a level of the delayed clock signal of each stage at a time point corresponding to a level falling edge of the echo clock signal.

It should be noted that, in multiple levels that are obtained, the first a levels are high levels, the middle b levels are low levels, the last c levels are high levels, and a, b, and c are positive integers.

For example, assuming that phases of the echo clock signal clk_tx, the clock signal clk_rx of the second clock domain, and clk_rx_dly_1 to clk_rx_dly_n are as shown in FIG. 5, then when a level falling edge (shown by A in FIG. 5) of clk_tx is detected, obtained levels of clk_rx_dly_1 to clk_rx_dly_n are 0x111110000000001111 (where "1" denotes a high level, and "0" denotes a low level), and it is obtained that a=5, b=9, and c=4.

S104: Determine, according to the level of the delayed clock signal of each stage, a phase difference between the echo clock signal and the clock signal of the second clock domain.

Optionally, the phase difference between the echo clock signal and the clock signal of the second clock domain is calculated according to a formula $$\lambda = \frac{b-a}{2 \cdot b} \cdot 360°,$$

where $\lambda$ denotes the phase difference.

For example, assuming that a=5, b=9, and c=4, it can be known, according to "b=9", that clk_tx has nine unit delays from a level falling edge to a level rising edge of a level, and therefore the phase of clk_tx has 2×9 unit delays in one cycle; and it can be known, according to "a=5 and b=9", that there are five unit delays from a level rising edge of clk_rx to a level falling edge of clk_tx; therefore, there are (9-5) unit delays from a rising edge of clk_rx to a previous rising edge of clk_tx, and it is obtained that a phase difference by which clk_rx lags behind clk_tx is ((9−5)/2×9)×360°=80°.

It can be seen from the foregoing that, in this embodiment of the present disclosure, N-stage delay is performed on the clock signal of the second clock domain, to obtain a delayed clock signal of each stage; and then a phase difference between the echo clock signal and the clock signal of the second clock domain may be obtained according to a level of the delayed clock signal of each stage at a voltage falling edge of the echo clock signal.

The data reading circuit in this embodiment of the present disclosure includes a phase difference determining module, a time delay detection module, and a reading control module, where the phase difference determining module can determine a phase difference between an echo clock signal and a clock signal of a local domain, the time delay detection module can detect a time delay value in internal transmission of data, and the reading control module can determine, according to the phase difference and the time delay value, a time point for reading data, thereby implementing data reading. In addition, in this embodiment of the present disclosure, except for I/O interfaces used to transmit the data and the echo clock signal, the phase difference between the echo clock signal and the clock signal of the local domain can be determined without the need to add an extra I/O interface between two clock domains, thereby reducing hardware overheads and difficulty in implementation.

A person of ordinary skill in the art may understand that all or some of the processes of the methods in the embodiments may be implemented by a computer program instructing relevant hardware. The program may be stored in a computer readable storage medium. When the program runs, the processes of the methods in the embodiments are performed. The foregoing storage medium may include a magnetic disk, an optical disc, a read-only memory (ROM), or a random access memory (RAM).

What is disclosed above is merely exemplary embodiments of the present disclosure, and certainly is not intended to limit the protection scope of the present disclosure. Therefore, equivalent variations made in accordance with the claims of the present disclosure shall fall within the scope of the present disclosure.

What is claimed is:

1. A data reading circuit applied to a second clock domain, wherein the second clock domain comprises a buffer configured to write data sent by a first clock domain, and a flip-flop configured to read data output by the buffer, wherein the first clock domain simultaneously sends the data and an echo clock signal, wherein the echo clock signal is a clock signal of the first clock domain, and wherein the data reading circuit comprises:
   a phase difference determining module connected to the echo clock signal and a clock signal of the second clock domain;
   a time delay detection module; and
   a reading control module coupled to the phase difference determining module and the time delay detection module,
   wherein the phase difference determining module is configured to:
      determine a phase difference between the echo clock signal and the clock signal of the second clock domain; and
      send the phase difference to the reading control module,
   wherein the time delay detection module is configured to:
      detect a time delay value in transmission of the data from the buffer to the flip-flop; and
      send the time delay value to the reading control module, and
   wherein the reading control module is configured to determine, according to the phase difference and the time delay value, a triggering edge, at which the flip-flop can read the data output by the buffer, of the clock signal of the second clock domain.

2. The data reading circuit according to claim 1, wherein the phase difference determining module comprises:
   N time delayers successively connected in series;
   N+1 D flip-flops; and
   a phase difference determining unit connected to the echo clock signal and configured to:
      determine, according to output results of the N+1 D flip-flops, the phase difference between the echo clock signal and the clock signal of the second clock domain; and
      send the phase difference to the reading control module,
   wherein N is an integer greater than 1,
   wherein an input port of a first time delayer of the N time delayers is connected to the clock signal of the second clock domain,
   wherein a time delay generated by the N time delayers is greater than a clock cycle of the clock signal of the second clock domain,
   wherein input ports of the N+1 D flip-flops are connected to the echo clock signal,
   wherein a clock port of a first D flip-flop of the N+1 D flip-flops is connected to the input port of the first time delayer,
   wherein clock ports of the remaining N D flip-flops are successively connected to output ports of the N time delayers, and wherein output ports of the N+1 D flip-flops of the N+1 D flip-flops are connected to the phase difference determining unit.

3. The data reading circuit according to claim 2, wherein the phase difference determining unit is further configured to:

obtain levels of output signals of a second D flip-flop to the (N+1)$^{th}$ D flip-flop at a time point corresponding to a level falling edge of the echo clock signal; and calculate, according to a formula $$\lambda = \frac{b-a}{2 \cdot b} \cdot 360°,$$

the phase difference between the echo clock signal and the clock signal of the second clock domain, wherein λ denotes the phase difference, wherein in the levels of the output signals, the first a levels are high levels, the middle b levels are low levels, the last c levels are high levels, and a, b, and c are positive integers.

4. The data reading circuit according to claim 3, wherein each D flip-flop of the N+1 D flip-flops is a D flip-flop that resists a metastable state.

5. The data reading circuit according to claim 2, wherein the phase difference determining module further comprises a switch component, wherein the input port of the first time delayer is connected to the clock signal of the second clock domain using the switch component, and wherein the switch component is configured to control connection and disconnection between the input port of the first time delayer and the clock signal of the second clock domain.

6. The data reading circuit according to claim 5, wherein the switch component is an inside clock generator (ICG) switch, wherein the input port of the first time delayer is connected to an output port of the ICG switch, wherein an input port of the ICG switch is connected to the clock signal of the second clock domain, wherein an enabling port of the ICG switch is connected to an enabling signal, and wherein the switch component is further configured to control connection and disconnection between the input port of the first time delayer and the clock signal of the second clock domain.

7. The data reading circuit according to claim 2, wherein each time delayer of the N time delayers is a gate circuit or multiple gate circuits connected in series.

8. The data reading circuit according to claim 1, wherein the reading control module is further configured to use a next rising edge, from a time point at which the buffer writes the data, of the clock signal of the second clock domain as a time point at which the flip-flop reads the data when the triggering edge at which the flip-flop reads the data output by the buffer is a rising edge and when a time value corresponding to the phase difference is greater than or equal to the time delay value.

9. The data reading circuit according to claim 1, wherein the reading control module is further configured to use the j$^{th}$ rising edge, from a time point at which the buffer writes the data, of the clock signal of the second clock domain as a time point at which the flip-flop reads the data, when a time value corresponding to the phase difference is less than the time delay value, according to a formula j=($\Delta t_{max}$−λ)/T+2, wherein $\Delta t_{max}$ denotes the time delay value, wherein λ denotes the phase difference, wherein / denotes an exact-division symbol, wherein T denotes a cycle of the clock signal of the first clock domain and a cycle of the clock signal of the second clock domain.

10. The data reading circuit according to claim 1, wherein the reading control module is further configured to use a next falling edge, from a time point at which the buffer writes the data, of the clock signal of the second clock domain as a time point at which the flip-flop reads the data when the triggering edge at which the flip-flop reads the data output by the buffer is a falling edge and when a time value corresponding to the phase difference is greater than or equal to the time delay value.

11. The data reading circuit according to claim 1, wherein the reading control module is further configured to use the j$^{th}$ falling edge, from a time point at which the buffer writes the data, of the clock signal of the second clock domain as a time point at which the flip-flop reads the data, when the time value corresponding to the phase difference is less than the time delay value, according to a formula j=($\Delta t_{max}$−T/2−λ)/T+2, wherein $\Delta t_{max}$ denotes the time delay value, wherein λ denotes the phase difference, wherein / denotes an exact-division symbol, and wherein T denotes a cycle of the clock signal of the second clock domain.

\* \* \* \* \*